US007955661B2

(12) United States Patent
Stevens et al.

(10) Patent No.: US 7,955,661 B2
(45) Date of Patent: Jun. 7, 2011

(54) TREATMENT OF MICROPORES IN MICA MATERIALS

(75) Inventors: Gary Stevens, Surrey (GB); James D. B. Smith, Monroeville, PA (US); John W. Wood, Winter Springs, FL (US)

(73) Assignee: Siemens Energy, Inc., Orlando, FL (US)

( * ) Notice: Subject to any disclaimer, the term of this patent is extended or adjusted under 35 U.S.C. 154(b) by 1171 days.

(21) Appl. No.: 11/656,727

(22) Filed: Jan. 23, 2007

(65) Prior Publication Data
US 2007/0114704 A1  May 24, 2007

Related U.S. Application Data

(63) Continuation-in-part of application No. 11/152,983, filed on Jun. 14, 2005, now abandoned.

(51) Int. Cl.
B05D 3/00 (2006.01)
B05D 3/12 (2006.01)
(52) U.S. Cl. .................. 427/407.1; 427/385.5
(58) Field of Classification Search ............. 427/407.1, 427/385.5, 372.2, 430.1; 264/643; 428/304.4, 428/325, 308.8, 332, 366, 90; 523/400
See application file for complete search history.

(56) References Cited

U.S. PATENT DOCUMENTS

| 2,996,106 A * | 8/1961 | McCarthy et al. ......... 156/89.28 |
| 3,069,302 A * | 12/1962 | Lewis et al. ................. 156/53 |
| 3,207,641 A * | 9/1965 | Simko, Jr. et al. ............ 156/175 |
| 3,246,271 A | 4/1966 | Ford |
| 3,427,189 A * | 2/1969 | Brechna ....................... 442/117 |
| 3,866,316 A | 2/1975 | Takechi et al. |
| 3,974,302 A | 8/1976 | Croop et al. |
| 4,001,616 A | 1/1977 | Lonseth et al. |
| 4,160,926 A | 7/1979 | Cope et al. |
| 4,335,367 A | 6/1982 | Mitsui et al. |
| 4,361,661 A | 11/1982 | Jackson |
| 4,400,226 A | 8/1983 | Horrigan |
| 4,427,740 A | 1/1984 | Stackhouse et al. |
| 4,491,618 A | 1/1985 | Kuwajima et al. |
| 4,634,911 A | 1/1987 | Studniarz et al. |
| 4,694,064 A | 9/1987 | Tomalia et al. |
| 4,704,322 A | 11/1987 | Roberts |
| 4,760,296 A | 7/1988 | Johnston et al. |
| 4,806,806 A | 2/1989 | Hjortsberg et al. |
| 5,011,872 A | 4/1991 | Latham et al. |
| 5,037,876 A | 8/1991 | Birkle et al. |
| 5,126,192 A | 6/1992 | Chellis et al. |
| 5,281,388 A | 1/1994 | Palmer et al. |
| 5,409,968 A | 4/1995 | Clatanoff et al. |
| 5,466,431 A | 11/1995 | Dorfman et al. |
| 5,510,174 A | 4/1996 | Litman |
| 5,540,969 A | 7/1996 | Schuler |
| 5,578,901 A | 11/1996 | Blanchet-Fincher et al. |
| 5,688,382 A | 11/1997 | Besen et al. |
| 5,723,920 A | 3/1998 | Markovitz et al. |
| 5,780,119 A | 7/1998 | Dearnaley et al. |
| 5,801,334 A | 9/1998 | Theodorides |
| 5,878,620 A | 3/1999 | Gilbert et al. |
| 5,904,984 A | 5/1999 | Smith et al. |
| 5,938,934 A | 8/1999 | Balogh et al. |
| 5,982,056 A | 11/1999 | Koyama et al. |
| 6,015,597 A | 1/2000 | David |
| 6,048,919 A | 4/2000 | McCullough |
| 6,103,382 A | 8/2000 | Smith et al. |
| 6,130,495 A | 10/2000 | Schulten et al. |
| 6,130,496 A | 10/2000 | Takigawa et al. |
| 6,140,590 A | 10/2000 | Baumann et al. |
| 6,160,042 A | 12/2000 | Ishida |
| 6,190,775 B1 | 2/2001 | Smith et al. |
| 6,238,790 B1 | 5/2001 | Smith et al. |
| 6,251,978 B1 | 6/2001 | McCullough |
| 6,255,738 B1 | 7/2001 | Distefano et al. |
| 6,261,424 B1 | 7/2001 | Goncharenko et al. |
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,344,271 B1 | 2/2002 | Yadav et al. |
| 6,359,232 B1 | 3/2002 | Markovitz et al. |
| 6,393,642 B1 | 5/2002 | Pollman et al. |

(Continued)

FOREIGN PATENT DOCUMENTS

DE 4244298 A1 6/1994

(Continued)

OTHER PUBLICATIONS

Yasufumi Shibata, Takenobu Sakai, Shingo Katayama, Noriko Yamada; "Lipophilic Inorganic-Organic Hybrid Materials with Low Frictional Coefficient Useful for Sliding Parts such as Piston Rings"; Jul. 31, 2002; pp. 1-3; STN Database No. 2002: 1568167; XP-002355912.

(Continued)

*Primary Examiner* — William Phillip Fletcher, III

(57) ABSTRACT

A method for the treatment of micro pores within a mica paper that includes: obtaining a silane with a molecular weight of between approximately 15 and 300, adding the silane to the mica paper, and reacting the silane with the inner surface of the micro pores within the mica paper. After this, a resin is impregnated into the mica paper, and the resin binds to the inner surfaces of the micro pores with the mica paper through the silane. In one embodiment, the mica paper is compressed by an amount between 5% and 30% of its original thickness. In another embodiment, the mica paper is compressed both prior to reacting the silane and during impregnation with the resin.

19 Claims, 4 Drawing Sheets

U.S. PATENT DOCUMENTS

| | | |
|---|---|---|
| 6,396,864 B1 | 5/2002 | O'Brien et al. |
| 6,426,578 B1 | 7/2002 | Mori et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,510,059 B2 | 1/2003 | Mitani et al. |
| 6,548,172 B2 | 4/2003 | David et al. |
| 6,572,937 B2 | 6/2003 | Hakovirta et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 | 4/2006 | Smith |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,425,366 B2 | 9/2008 | Okamoto et al. |
| 7,547,847 B2 | 6/2009 | Miller |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2002/0146562 A1 | 10/2002 | Morita et al. |
| 2003/0035960 A1 | 2/2003 | Tsunoda et al. |
| 2003/0040563 A1 | 2/2003 | Sagal et al. |
| 2003/0139510 A1 | 7/2003 | Sagal et al. |
| 2004/0094325 A1 | 5/2004 | Yoshida et al. |
| 2004/0102597 A1 | 5/2004 | Tobita et al. |
| 2004/0122153 A1 | 6/2004 | Guo et al. |
| 2004/0152829 A1 | 8/2004 | Tobita et al. |
| 2004/0241439 A1 | 12/2004 | Morita et al. |
| 2005/0097726 A1 | 5/2005 | Yamamoto et al. |
| 2005/0116336 A1 | 6/2005 | Chopra et al. |
| 2005/0161210 A1 | 7/2005 | Zhong et al. |
| 2005/0208301 A1 | 9/2005 | Okamoto et al. |
| 2005/0236606 A1 | 10/2005 | Toas et al. |
| 2005/0245644 A1 | 11/2005 | Smith et al. |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2007/0222307 A1 | 9/2007 | Sawa et al. |
| 2008/0050580 A1 | 2/2008 | Stevens et al. |
| 2008/0066942 A1 | 3/2008 | Miller |
| 2008/0262128 A1 | 10/2008 | Stevens et al. |
| 2009/0238959 A1 | 9/2009 | Smith et al. |

FOREIGN PATENT DOCUMENTS

| | | |
|---|---|---|
| EP | 0 157 936 A1 | 10/1985 |
| EP | 0 266 602 A1 | 5/1988 |
| EP | 0 394 767 A2 | 10/1990 |
| EP | 0 604 804 A2 | 7/1994 |
| EP | 1 220 240 A1 | 7/2002 |
| EP | 1 300 439 A1 | 4/2003 |
| EP | 1 383 226 A1 | 1/2004 |
| EP | 1 384 567 A1 | 1/2004 |
| EP | 1 486 997 A1 | 12/2004 |
| EP | 1 530 223 A1 | 5/2005 |
| GB | 881036 | * 11/1961 |
| JP | 56029305 A | 3/1981 |
| JP | 03205443 A | 9/1991 |
| JP | 06076624 | 3/1994 |
| JP | 06313267 A | 11/1994 |
| JP | 08-020673 | 1/1996 |
| JP | 10-088201 | 4/1998 |
| JP | 10-211659 | 8/1998 |
| JP | 2002212422 A | 7/2002 |
| JP | 2002322243 A | 11/2002 |
| JP | 200506389 A | 1/2005 |
| JP | 2005-199562 A | 7/2005 |
| WO | WO 95/02504 A1 | 1/1995 |
| WO | WO 96/28073 A1 | 9/1996 |
| WO | 9841993 A1 | 9/1998 |
| WO | WO 99/26286 A1 | 5/1999 |
| WO | WO 00/56127 A1 | 9/2000 |
| WO | WO 01/68749 A1 | 9/2001 |
| WO | WO 01/84659 A1 | 11/2001 |
| WO | WO 03/040445 A1 | 5/2003 |
| WO | WO 2004/006271 A1 | 1/2004 |
| WO | WO 2004/052999 A2 | 6/2004 |
| WO | WO 2004/067606 A1 | 8/2004 |
| WO | WO 2005/069312 | 7/2005 |
| WO | WO 2005/106089 A2 | 11/2005 |
| WO | 2005123825 A1 | 12/2005 |
| WO | WO 2005/124790 A2 | 12/2005 |
| WO | WO 2006/002014 A1 | 1/2006 |
| WO | WO 2006/007385 A1 | 1/2006 |

OTHER PUBLICATIONS

Tomoyuki Matsumura, Ryuji Takahashi, Kazuya Nagata, Mitsukazu Ochi; "Phase Structures and Thermal and Conductive Properties of Epoxy-Alumina Hybrids Filled with Conductive Fillers"; Apr. 8, 2002; pp. 1-2; STN Database No. 2002:257918; XP-002356007.

Von Roll / Isola; "Mica Tapes"; Product literature Samicapor® HTC 381.58; p. 1.

Tari et al., "Impacts on Turbine Generator Design by the Application of Increased Thermal Conducting Stator Insulation" Cigre SC11-01 Meeting, Paper No. 132 (2002).

Sun et al., "Fundamental Research on Surface Modification of Nano-sized Silica for Underfill Applications" 2004 Electronic Components and Technology Conference (2004).

Brutsch et al., "New High Voltage Insulation with Increased Thermal Conductivity" Electrical Electronics Insulation Conference 1993 Proceedings, (Oct. 1993).

Tari et al., "A High Voltage System with Increased Thermal Conductivity for Turbo Generators" Coil Winding, Insulation and Electrical Manufacturing Conference (2001).

Derwent Acc-No. 1980-39239C (JP 55053802 A Derwent Abstract) (Nippon Mica Seisaku), (1980).

Product Data Sheet for Polar Therm Boron Nitride Powder Grades PT120, PT140, PT160, and PT 180, provided by Momentive Performance Materials (2007).

POSS® Enhanced Thermosets, Product Brochure from Hybrid Products, Inc., date unknown.

Production Information Sheet for D.E.R.™ 330 (Liquid Epoxy Resin) from The Dow Chemical Co., date unknown.

* cited by examiner

TREATMENT OF MICROPORES IN MICA MATERIALS

CROSS-REFERENCE TO RELATED APPLICATIONS

This application is a continuation-in-part of U.S. application Ser. No. 11/152,983 entitled "High Thermal Conductivity Materials Incorporated into Resins," filed Jun. 14, 2005, by Smith et al., now abandoned, which is incorporated herein by reference.

FIELD OF THE INVENTION

The field of the invention relates to the treatment of micropores in mica for improved incorporation of resin and the diminishment of microvoids after processing and resin cure.

BACKGROUND

With the use of any form of electrical appliance, there is a need to electrically insulate conductors. With the push to continuously reduce the size and to streamline all electrical and electronic systems, there is a corresponding need to find better and more compact insulators and insulation systems.

Because they have the practical benefit of being tough and flexible electrical insulation materials that can be easily adhered to surfaces, various epoxy resin materials have been used extensively in electrical insulation systems. Traditional electrical insulation materials, such as mica flake and glass fiber, can be surface coated and bonded with these epoxy resins, to produce composite materials with increased mechanical strength, chemical resistance and electrical insulating properties. Epoxy resins frequently replace traditional varnishes, although some high voltage equipment continues to utilize such materials.

Because of their nature, materials which are good electrical insulators are inherently good thermal insulators, which, is undesirable. Thermal insulating behavior, particularly for air-cooled electrical equipment and components, reduces the efficiency and durability of the components as well as the equipment as a whole. The production of electrical insulation systems having maximum electrical insulation and minimal thermal insulation characteristics is desirable.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene glycol terephthalate mat, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example, glass fiber, may be applied to the coil.

Generally, multiple layers of the mica tape 16 are wrapped about the coil -with sixteen or more layers generally being used for high voltage coils. Resins are then impregnated into the tape layers. Resins can even be used as insulation independently from the insulating tape. Unfortunately this amount of insulation only further adds to the complications of dissipating heat.

During service in high voltage electrical equipment, microvoids can be created during resin cure and interfacial delamination because mica has poor wetting and adhesion with the impregnating resin, such as epoxy. The micro pores within the mica are particularly poor for wetting and adhesion of resin to since they are deep within the mica paper. The primary insulator is mica in the form of flakes or platelets, which are then used in splittings or paper. During winding and subsequent processing of the insulation, mica tapes have adequate mechanical strength, but poor wetting.

The poor wetting characteristics make it difficult to get the impregnating resin, and fillers within the resin, to penetrate and adhere to these micropore areas of the mica. This poor wetting of impregnating resin and fillers may cause air gaps in the structure which reduce thermal conductivity, consequently lowering thermal conduction properties in the mica insulation. Additionally, this poor wetting results in microvoid formation, which in turn causes partial discharges under high voltage within the insulation structure. This results in inferior voltage endurance, thereby reducing the service lifetime of the electrical equipment.

What is needed are better techniques and approaches to getting resins to adhere to the inner surfaces of the . mica micropores. Other difficulties with the prior art also exist, some of which will be apparent upon further reading.

SUMMARY OF THE INVENTION

With the foregoing in mind, methods and apparatuses consistent with the present invention, which inter alia facilitates the treatment of micro pores within a mica paper so that resin added to the mica will bond to the mica, greatly reducing the number of micropores left vacant by the resin. This method includes the treatment of the micropores with a low molecular weight silane, which can be in a liquid solution or vapor form. Additionally, the silanes may attract nanoparticle fillers that have matching surface functionalization. Compression of the mica, so that flakelet surfaces abut, and do not allow for the penetration of the silane between them, can enhance the selectivity of the silane treatment for the micropores, These, along with other objects, features, and advantages in accordance with the present invention, are provided for in particular embodiments by a method for the treatment of micropores within a mica paper that comprises obtaining a silane with a molecular weight of between approximately 15 and 300, and adding the silane to the mica paper. The silane is then reacted with the inner surface of the micropores within the mica paper. A resin is then impregnated into the mica paper, and the resin binds to mica surface through the silane.

In particular embodiments, the silane is added to the mica paper by a solvent. The solvent is substantially dried prior to impregnation. The silane is one or more of silane ($SiH_4$), silanol ($SiH_3OH$), methylsilane ($SiH_3CH_3$), vinylsilane ($SiH_3CHCH_2$), aminosilane ($SiH_3NH_2$), alkoxysilane ($SiH_3OR$) and epoxysilane. Or the silane can be one or more of amino methyl trimethyl silane, 3-glycidyl oxy propyl trimethoxy silane, vinyl dimethyl silane, and allyl trimethyl silane. In some cases the smaller silane has a molecular weight of between 32-90. The larger types of silane have a molecular weight of between 100-300. The larger types of silane do not tend to go between contacted mica surfaces in the mica paper as much as the smaller types. In other particular embodiments, multiple weights of silane molecules are used.

In certain embodiments, the resin contains nano fillers which comprise 1-60% of the resin by weight. In some cases at least some of the nano fillers have been surface treated so that they may react with the silane, as will be discussed below. The mica paper may be compressed prior to the addition of the silane, or if compressed after would allow for the removal of excess silane solution during the compression.

Another specific embodiment of the present invention provides for a method for the treatment of micropores within a mica paper that comprises obtaining a silane with a molecular weight of between approximately 15 and 300, compressing the mica paper, and then adding the silane to the mica paper. Then, reacting the silane with the inner surface of the micro pores within the mica paper, and impregnating the mica paper with a resin. The resin binds to the inner surfaces of the micro pores within the mica paper through the silane, which results in the contacted mica flakelet surfaces within the mica paper being less susceptible to exposure to the silane due to the compression.

In particular embodiments, the amount of compression of the mica paper is between 5-30% of the thickness of the mica paper. The mica paper is compressed for the impregnation of the resin, and the amount of compression for the impregnation of the resin is approximately the same as the amount of compression for the addition of the silane. In some cases the silane is added to the mica paper in solution, and the mica paper is substantially dried of the solution prior to the resin impregnation. Also, a lower molecular weight silane of between 32-90 can be used.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

Figure 1:
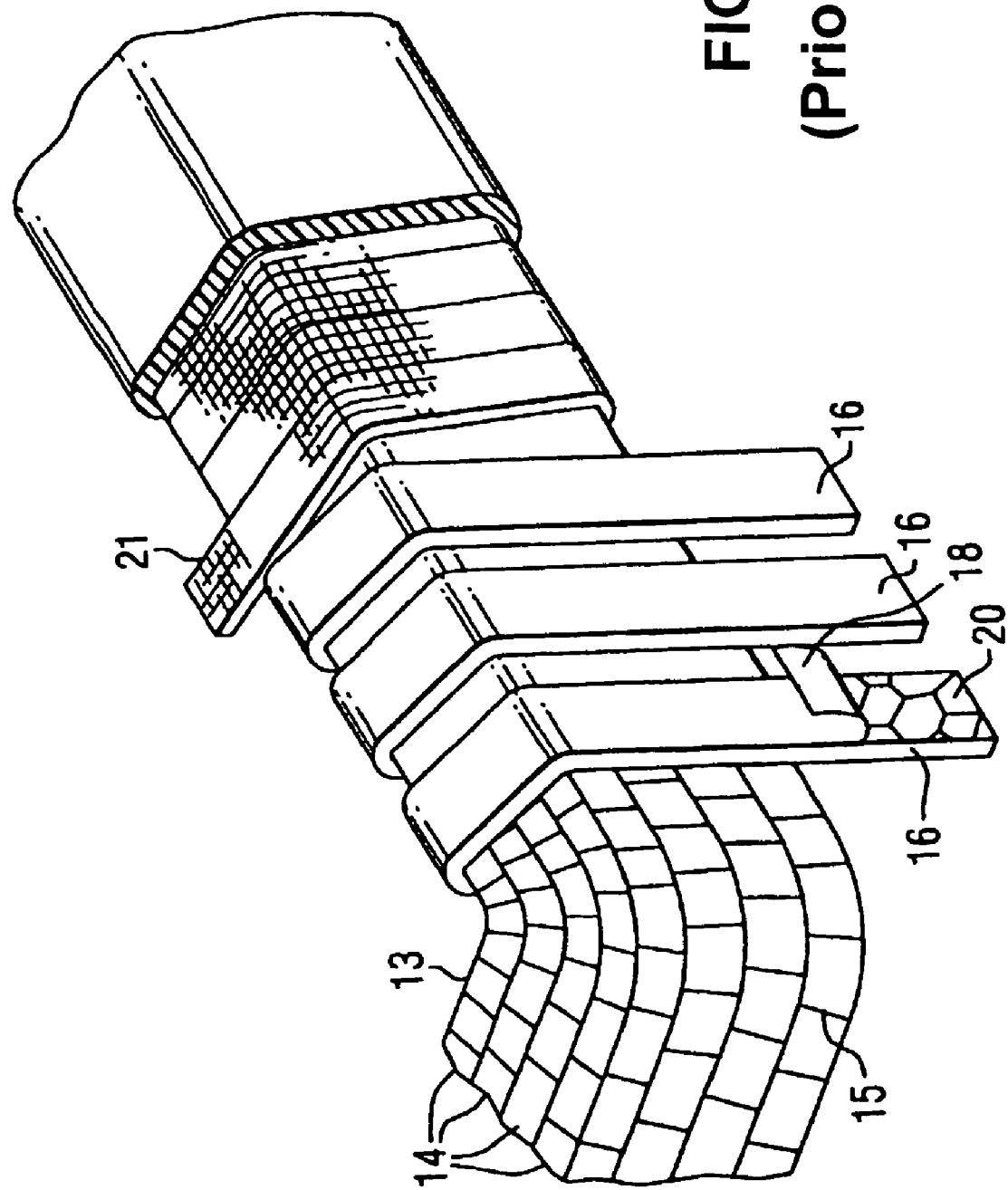
FIG. 1 shows the use of an insulating tape being lapped around a stator coil according to the prior art.

The present invention provides for a system and method of treating the interconnecting micro pores within a mica paper (matrix) with a silane, allowing that a later impregnated resin will bond to the mica via the silane. The silane is of a low molecular weight and contains at least one functional group to bind to the mica. The impregnated resin then binds to the silane, and additionally filler, such as nanofillers, may be present in the resin and can even themselves be bound to the silane depending on surface functionalizations. The silane and mica bonding may be controlled by compressing the mica so that flakelet surfaces are blocked by other mica flakes.

Unlike previous mica treatments, the present invention is able to target the micro pores by compression of the micro flakelets. This improves the resin entering and bonding to the microvoid regions within a mica paper, thereby increasing thermal conductivity and voltage endurance.

The present invention treats micro pores within the mica with a silane, and in particular, one of low molecular weight silane. The silane provides a more effective bonding to the mica, and will effectively coat the inner surface of the pore. This greatly improves wetting characteristics of an impregnated resin, effectively enhancing adhesion while additionally diminishing or eliminating microvoids that otherwise would have formed.

The impregnated resin may be a high thermal conductivity (HTC) composite. HTC composites comprise a resinous host network combined with fillers (i.e. nanofillers, even though they may be micro and meso in size) that are two phase organic-inorganic composite materials. Also HTC materials may be formed by organic-inorganic hybrid materials which are formed from organic-inorganic continuous phase, that are based on molecular alloys, and from discrete organic-dendrimer composites in which the organic-inorganic interface is non-discrete with the dendrimer core-shell structure. Ensuring that the length scales of the structural elements are shorter than or commensurate with the phonon distribution responsible for thermal transport enhances phonon transport and reduces phonon scattering.

Two phase organic-inorganic composites may be formed by incorporating inorganic micro, meso or nano-particles in linear or cross linked polymers (thermoplastics) and thermosetting resins. Host networks include polymers and other types of resins, definitions of which are given below. In general, the resin that acts as a host network may be any resin that is compatible with the particles and, if required, is able to react with the groups introduced at the surface of the filler. For organic-inorganic hybrids nano-particle dimensions are typically of the order of or less than the polymer network segmental length. For example 1-30 nm. The inorganic particles may contain reactive surfaces to form covalently bonded hybrid organic-inorganic homogeneous materials. The particles may be oxides, nitrides, carbides and hybrid stoichiometric and non-stoichiometric mixes of the oxides, nitrides and carbides, more examples of which are given below.

The inorganic particles are surface treated to introduce a variety of surface functional groups which are capable of participating in reactions with the host network. The surface functional groups include but are not limited to hydroxyl, carboxylic, amine, epoxide, silane and vinyl groups. The groups may be applied using a variety of methods which include wet chemical methods, non-equilibrium plasma methods, chemical vapor and physical vapor deposition, sputter ion plating and electron and ion beam evaporation methods.

The discrete organic-dendrimer hybrids may be reacted together or with the resin matrix to form a single material. The surface of the dendrimer can contain reactive groups similar to those mentioned above, which will either allow dendrimer-dendrimer or dendrimer-organic matrix reactions to occur. The dendrimer will have an inorganic core and an organic shell containing the reactive groups of interest. It may also be possible to have an organic core with an inorganic shell which also contains reactive groups such as hydroxyl or silane groupings which can participate in inorganic reactions similar to those involved in common sol-gel chemistries.

Regarding the use of non-discrete organic-inorganic hybrids, it is possible to use sol-gel chemistry to form a continuous molecular alloy. Sol-gel chemistries involving aqueous and non-aqueous reactions may be used. Other compounds for the formation of organic-inorganic hybrids include the polyhedral oligomeric silsesquioxanes (POSS), tetraethyl orthosilicate (TEOS) and tetrabutyl orthotitanate (TBOT) and related monomeric and oligomeric hybrid compounds which are organic functionalized inorganic compounds. In the example of POSS, molecules are built around a building block of R—SiO$_{1.5}$ in which the R group is chosen to compatibilize with and/or react with other organic compounds and the host network. The base compounds may be combined to yield larger molecules commensurate with the size of polymer segment and coil structures. POSS may be used to create organic-inorganic hybrids and may be grafted into existing polymers and networks to control properties, including thermal conductivity. Suppliers such as Aldrich™ Chemical Co., Hybrid Plastics™ Inc. and Gelest™ Inc. can provide the materials.

As previously discussed, the silane is of low molecular weight and is carried into the micro pores by a liquid solvent. Solvents are known in the art and include ketones, ethers and hydrocarbons like toluene and xylene. Mixtures of solvents can also be used. Additionally, more volatile silanes can be dispersed by a vapor method in a gaseous fluid. These methods of impregnation will insert the silane without causing significant dispersing of the mica, and whatever form the mica is in, like paper.

The low molecular weight silanes should be in the range of approximately 32-300 which is primarily determined by the functional group(s) or side chain(s). Examples of suitable silane compounds include simple silane (SiH$_4$), silanol (SiH$_3$OH), methylsilane (SiH$_3$CH$_3$), vinylsilane (SiH$_3$CHCH$_2$), aminosilane (SiH$_3$NH$_2$), alkoxysilane (SiH$_3$OR) and epoxysilane. Functionalities can include amino, epoxy, vinyl and allyl. Examples of slightly larger functional silanes, which are still low molecular weight molecules include amino methyl trimethyl silane, 3-glycidyl oxy propyl trimethoxy silane, vinyl dimethyl silane, and allyl trimethyl silane.

Once-the resin is added, the resulting chemical bond structure can be generalized as:

mica-Si—R-resin or in some instances:

mica-Si—R-filler when the nanofillers have been suitably functionalized. Various types of silanes can be used in the same treatment. Silanes which are less polar will function better for the treatment of the micro pores, however this becomes less of an issue as the silanes increase in weight.

The filler may be surface functionalized, but even without surface functionalization of the fillers, the micro pores will see increased concentration of any fillers present in the resin. This is because the treatment of the micro pores with low molecular weight silane greatly increases the attachment of the impregnated resin to the mica pore surface. This ensures greater retention and utilization of the fillers in the mica pore network, which gives enhanced thermal conductivity and voltage endurance to any products, such as mica paper and groundwall insulation.

To selectively coat the micro pores instead of the entire mica flakelet, the mica is compressed, such that the mica surfaces contact with other mica flakelet, denying the silane an exposed surface. If too much of a flakelet's surface is treated with silane, as would be the case with the entire surface being coated, then paper, tapes and other products will lack voltage endurance needed in industry. In many instances of this embodiment, the mica is compressed when it is already in paper and/or tape form. Although this compression will also make buried micro pores less accessible, there will still be diffusion of the silanes over time. Therefore, optimal diffusion of the silane into the micro pores will be a function of time and the amount of compression.

The amount of compression of the mica depends on what form the mica is in. Typically, the mica used in industry is present as a paper typically 3 to 6 mils in thickness, and often blacked with a fabric to form a tape. In this form, a 5-30% compression in thickness will be used to contact exposed mica flakelet surfaces to deny exposure to the silane treatment, although some small amount of silane will reach the compressed surfaces. The greater the compression, the less the contacted surfaces will be exposed to the silane treatment, but this will also result in a longer time for the silane to reach the buried pores. As a benchmark, a typical impregnating resin can impregnate an uncompressed tape layer in about 30-60 seconds at the impregnation temperature.

Figure 2:
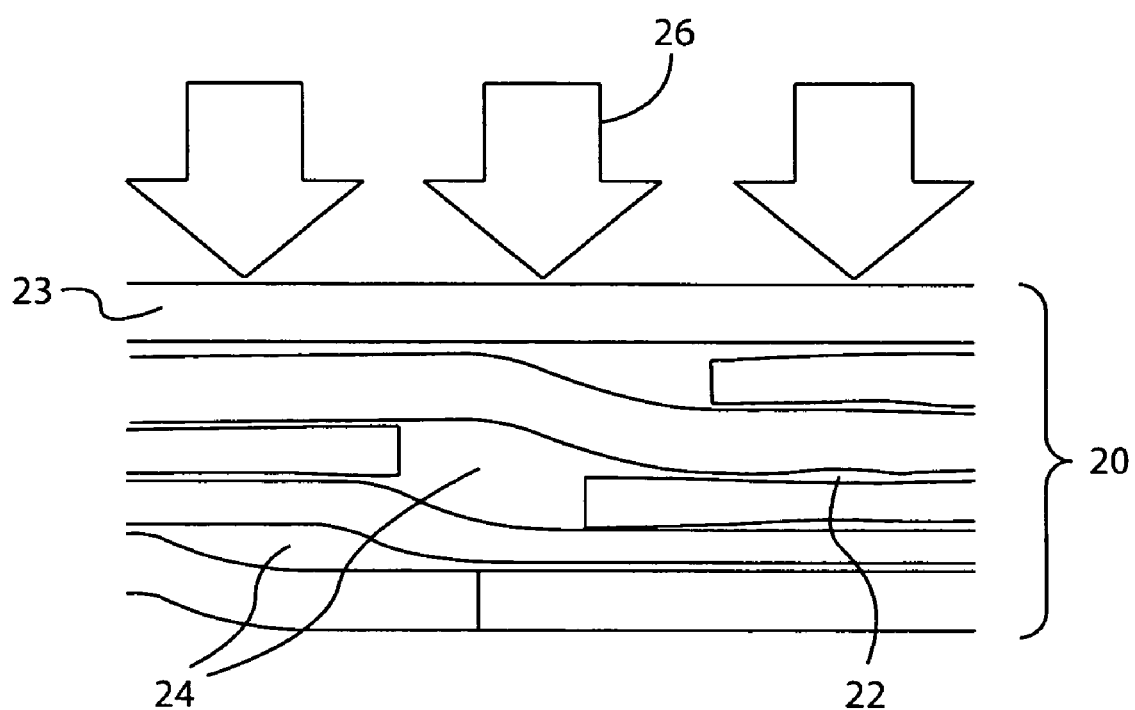
FIG. 2 illustrates a stylized view of a cross section of mica tape and mica pores being compressed for silane treatment.

FIG. 2 shows a cross sectional view of a section of mica paper 20, which is composed of many small mica flakelets 23 that are randomly stacked atop of one another. The micro pores 24 are created by a mismatching of the mica flakes. These pore surfaces are treated with a silane solution when the paper is under partial compression 26. The target pores for the silane treatment are approximately 50 nm in diameter or larger, after compression. At least 75% of the 50 nm or greater sized pores should be treated with the silane.

The compression will reduce or eliminate both large and very small pores, such as exposed surfaces between the flakelet layers 22. Once compression is released, many of these pores will then return to their previous size. If the mica tape is to be later impregnated with resin under pressure, however, these smaller pores will again disappear. In one particular embodiment the amount of compression used for the silane treatment is approximately equal to the compression to be used for later resin impregnation. If the tape is applied dry to the stator coils, for GVPI normally the coils do not have large amounts of compression, but can bulge due to air spaces. These tapes are compressed 1-5%. But for high voltage GVPI coils the aim is 5-15%. For VPI, normal compression is around 20%. Note that this mechanical compression is not the pressure exerted by the impregnating resin.

One method for treating the resin under compression involves placing the mica paper in a silane solution bath following its compression. Another method is to use porous rollers that can compress and treat the mica paper. The porous rollers can be perforated or can be made with porous material, such as industrial sponge. Multiple compression and treatment cycles can also be performed.

After treatment, the excess silane solution is allowed to drain off and/or allowed to evaporate off, possibly with the addition of heat. The mica should be kept under compression until it is dry or nearly dry. Once the pores have been treated, the resin can be impregnated into the mica.

The size of the silane molecules can also be used as a factor in treating the micro pores. Larger molecules, closer to the 300 molecular weight range discussed above, will not get between contacted mica flakelet surfaces as readily as the smaller molecules. However, larger molecules will not find their way to the micro pores as readily as smaller molecules either. Therefore, depending on the ability to compress the mica and the desirability to coat micropores versus not coating contacted flakelet surfaces, smaller or larger silane molecules can be used. For example, if the ability to compress the mica is good, then the worry about exposing contacted surfaces is diminished, and lower molecular weight silanes can be used. Also, if the desire to coat the micropores is much greater than the desire to not have silanes come between contact surface, then lower molecular weight silanes can be used. Note that in this context, lower refers to silanes closer to the smaller end of the 32-300 mW scale, and larger refers to silanes closer to the higher end of that same scale. Both types are still low molecular weight silanes of the present invention.

In a specific embodiment the present invention provides for a method for the treatment of micro pores within a mica paper that comprises obtaining a silane with a molecular weight of between approximately 15 and 300, and adding the silane to the mica paper. Then reacting the silane with the inner surface of the micro pores within the mica paper. Following this reaction, a resin is impregnated into the mica paper, and through the silane, the resin binds to the inner surfaces of the micro pores with the mica paper.

In particular embodiments, the silane is added to the mica paper by a solvent which is substantially dried prior to impregnation. The silane is one or more of silane (SiH4), silanol (SiH3OH), methylsilane (SiH3CH3), vinylsilane (SiH3CHCH2), aminosilane (SiH3NH2), alkoxysilane (SiH3OR) and epoxysilane. Or the silane can be one or more of amino methyl trimethyl silane, 3-glycidyl oxy propyl trimethoxy silane, vinyl dimethyl silane, and allyl trimethyl silane. In some cases the smaller silane has a molecular weight of between 32-90. The larger types of silane have a molecular weight of between 100-300, whereby the silane does not tend to go between contacted mica surfaces in the mica paper as much and can also-be used. In other particular embodiments, multiple weights of silane molecules are used.

In certain embodiments, the resin contains nano fillers. The nano fillers comprise 1-60% of the resin by weight. In some cases at least some of the nano fillers have been surface treated so that they may react with the silane. Prior to the addition of the silane, the mica paper may be compressed.

In another specific embodiment, the present invention provides for a method for the treatment of micro pores within a mica paper that comprises obtaining a silane with a molecular weight of between approximately 15 and 300, compressing the mica paper, and then adding the silane to the mica paper. Then reacting the silane with the inner surface of the micro pores within the mica paper, and impregnating the mica paper with a resin. The resin binds to the inner surfaces of the micro pores with the mica paper through the silane, and due to the compression, contacted mica flakelet surfaces within the mica paper are less susceptible to exposure of the silane. To optimal quality, the compression should be maintained through the curing cycle.

In particular embodiments, the amount of compression of the mica paper is between 5-30% of the thickness of the mica paper. The mica paper is compressed for the impregnation of the resin, and where the amount of compression for the impregnation of the resin is approximately the same as the amount of compression for the addition of the silane. In some cases the silane is added to the mica paper in solution, and the mica paper is substantially dried of the solution prior to the resin impregnation. Also, a lower molecular weight silane of between 32-90 can be used.

As mentioned, in order to reduce phonon scattering, it is important to control the structural form of the materials. This can be further assisted by using nano-particles whose matrices are known to exhibit high thermal conductivity and to ensure that the particles size and its interfacial characteristics with the resin are sufficient to sustain this effect, and also to satisfy the length scale requirement to reduce phonon scattering. Choosing more highly ordered structures will also benefit this, including reacted dendrimer lattices having both short and longer range periodicity and ladder or ordered network structures that may be formed from a host resin, such as liquid crystal epoxies and polybutadienes.

The filled resins may be used as bonding resins in a variety of industries such as circuit boards and insulating tapes. A particular kind of insulating tape is the mica-glass tape used in the electrical generator fields. Resins with these types of tapes can be used as bonding resins, or as impregnating resins as is known in the art. The filled resin without the tapes may also be used in the electrical generator to fulfill electrical insulation applications in the rotating and static electrical equipment components.

The tapes may be impregnated with resin before or after their application to electrical objects. Resin impregnation techniques include VPI and GVPI, discussed more below. In VPI, once a tape is lapped and impregnated it is compressed. Once in position, the resin in the compressed tape is cured, which effectively locks the position of the HTC materials. In some embodiments the resin is cured in a two stage process, as will be apparent to one of ordinary skill in the art. However, optimal compression of the loaded HTC materials favors a completely uncured resin during the compression stage.

Figure 3:
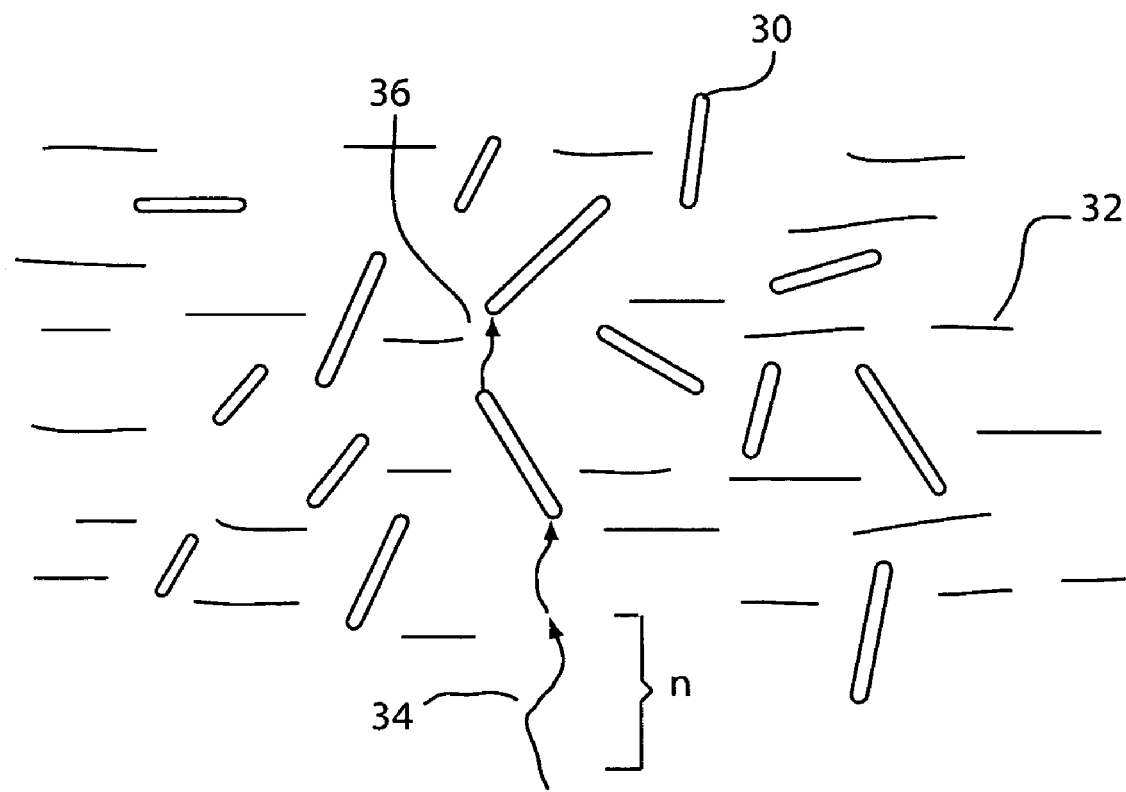
FIG. 3 illustrates phonons traveling through a loaded resin of the present invention.

FIG. 3 shows one embodiment of the present invention. Illustrated here are HTC materials 30 loaded into a resinous matrix 32. Phonons 34 traveling through the matrix have a mean path length n, this is the phonon mean free path. This path length can vary depending on the exact composition of the resin matrix, but is generally from 2 to 100 nm, and more typically 5-50 nm, for resins such as epoxy resins. Therefore the mean distance between the loaded HTC materials should be on average less than this distance. Note that the distance between the HTC materials can vary in the thickness versus transverse direction of the tape, and generally, it is the thickness direction where the spacing needs to be optimized.

As phonons 34 travel through the resin 32 they will tend to pass along the embedded HTC materials 30. This will increase the local phonon flux since the raw HTC materials will have a thermal conductivity of between 10-1000 W/mK, as opposed to the resin which is about 0.1-0.5 W/mK. As phonons pass along a loaded HTC material the phonons 36 pass to the next HTC material if the distance between the materials is less than n, therefore the HTC materials form an interconnecting network. FIG. 3 illustrates an idealized path. In practice there will be phonon scattering as the phonons pass between the resin and HTC materials, although there will be less scattering the shorter the distance between the materials, and the better the match of phonon propagation characteristics between the HTC materials and the resin.

The amount of HTC materials loaded in the resin could actually be quite low, for example about 10% as illustrated in FIG. 3. The average distances, or length scales, between loaded HTC materials therefore may be slightly greater than n, however, a large percentage will still be less than n and therefore fall within embodiments of the present invention. In particular embodiment, the percentage materials that are less than n distance from the next HTC material is over 50%, with particular embodiment being over 75%. In a particular embodiment, the average length of the HTC materials is greater than n, further aiding in phonon transport.

The shorter n the greater the concentration of loaded HTC materials, and conversely, the greater the particle size, the less HTC materials needed. Particular embodiment use 5-60% loaded HTC materials by total volume of the resins and fillers, with more particular embodiments at 25-40%. When the resin is impregnated into the tape, it will fill up the spaces between the tape fibers and substrates. The HTC distribution within the tape at this point, however, is often not optimized, and can even have the mean distance between HTC materials greater than n. Practice of the present invention then compresses the resin impregnated tapes and reduces the distances between the loaded HTC materials.

When a loaded resin is being impregnated into a tape, the fibers or particles of the tape act to block some of the HTC materials, particularly if the resin is 30% or more filler. However, by compressing the tapes, the reverse happens, and more fillers are trapped within the tape as the HTC materials attach themselves to non-mobile parts of the overall structure. The HTC fillers even get pinned to one another. In the embodiments given, it has been implied that the fillers do not react with the resin matrix, however, in some embodiments the fillers do form covalent bonds with the resin and form more homogeneous matrixes. In a homogenous matrix, resin molecules that are bound to fillers are better retained than the unbound resin molecules during compression.

Resins are used in a plurality of industries, and have a large number of uses. Different properties of the resins affect not only their uses, but also the quality and efficiency of the products that they are used with. For example, when resins are used in electrical insulation applications, their characteristics of dielectric strength and voltage endurance needs to be high, as does the thermal stability and thermal endurance. However, often contrary to these objectives, resins usually will also have a low thermal conductivity. The present invention balances the various physical properties of resins and the insulation system they are introduced into to produce a system that has a higher thermal conductivity than conventional electrically insulating materials while maintaining adequate, and even enhancing, key physical properties such as dielectric strength, voltage endurance, thermal stability and thermal endurance, mechanical strength and viscoelastic response. Delamination and microvoid formation resulting from stresses caused by thermal and mechanical cycling effects are reduced or eliminated. As used herein, the term resin refers to all resins and epoxy resins, including modified epoxies, polyesters, polyurethanes, polyimides, polyesterimides, polyetherimides, bismaleimides, silicones, polysiloxanes, polybutadienes, cyanate esters, hydrocarbons etc. as well as homogeneous blends of these resins. This definition of resins includes additives such as cross-linking agents, accelerators and other catalysts and processing aids. Certain resins, such as liquid crystal thermosets (LCT) and 1,2 vinyl polybutadiene combine low molecular weights characteristics with good crosslinking properties. The resins can be of an organic matrix, such as hydrocarbons with and without hetero atoms, an inorganic matrix, containing silicate and/or alumino silicate components, and a mixture of an organic and inorganic matrix. Examples of an organic matrix include polymers or reactive thermosetting resins, which if required can react with the reactive groups introduced on inorganic particle surfaces. Cross-linking agents can also be added to the resins to manipulate the structure and segmental length distribution of the final crosslinked network, which can have a positive effect on thermal conductivity. This thermal conductivity enhancement can also be, obtained through modifications by other resin additives, such as catalysts, accelerators and other processing aids. Certain resins, such as liquid crystal thermosets (LCT) and 1,2 vinyl polybutadiene combine low molecular weights characteristics with good crosslinking properties. These types of resins tend to conduct heat better because of enhanced micro and macro ordering of their sub-structure which may lead to enhanced conduction of heat as a result of improved phonon transport. The better the phonon transport, the better the heat transfer.

When the high thermal conductivity fillers of the present invention are mixed with resins they form a continuous product. In some cases, covalent bonds are formed between the fillers and the resin. However, continuous is somewhat subjective and depends on the scale to which the observer is using. On the macro-scale the product is continuous, but on the nano-scale there can still, be distinct interfaces between the fillers and the resin network. Therefore, on the macro-scale, when referring to high thermal conductivity fillers mixing with the resin, a continuous organic-inorganic composite is formed, while on the micro-scale, the same mixture can be referred to as a hybrid.

As mentioned, filled resin may be used in the electrical generator field without the tapes to fulfill electrical insulation applications in the rotating and static electrical equipment components. The use of high thermal conductivity materials in a generator is multiple. Within the stator coil there are component materials other than the groundwall which must have high thermal conductivity to optimize the design. Likewise other components associated with the coils to maximize heat removal. Developments in stator design dictate that improvements be made to rotor design in order to maximize generator efficiency.

Examples of these places, components, and materials to which the high thermal conductivity technology described herein can be applied in a stator include inter-strand insulation, internal corona protection (ICP) systems, outer corona protection (OCP) systems, bottom, center, and top fillers including packing and prestressed driving strips (PSDS—top ripple springs); side fillers, laminates, and side PSDS, coil center separator or sword, coil transposition filler, stator wedge, core insulation, diamond spacers, braces or brackets, end-winding bonding resin and compressible gap fillers, connector insulation, parallel ring insulation and parallel ring support structure. In a rotor, examples include cell or slot liner, interturn insulation, turn and ground insulation where integral, end cap insulation, blocking, radial pins and leads and slot top packer or "U".

Figure 4:
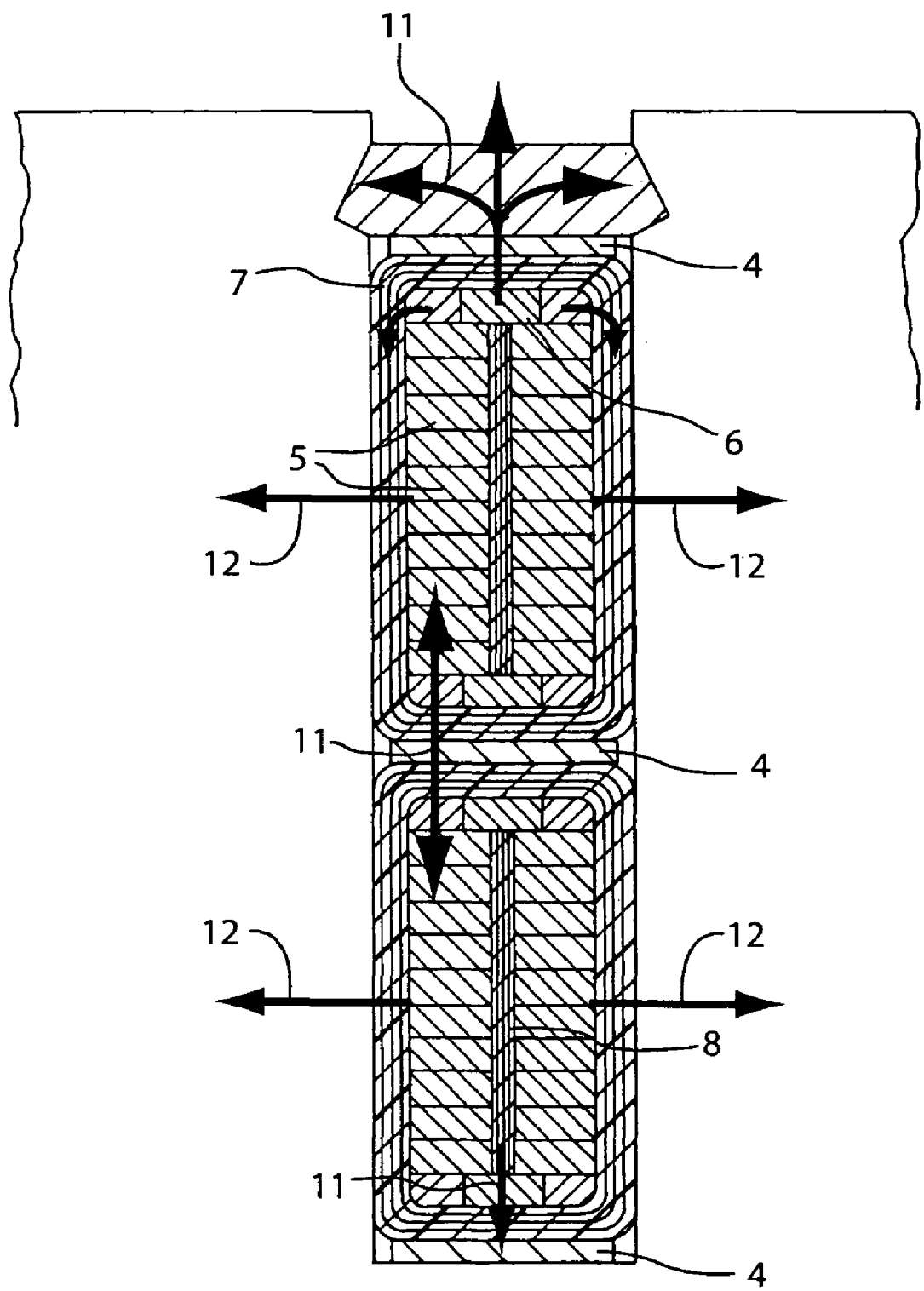
FIG. 4 illustrates heat flow through stator coils.

For clarity, reference is made to FIG. 4, showing a cross sectional view of the main heat flow 12. and the radial additional heat flow 11 through stator coils. The stator coil depicted by this figures includes copper stands 5, transposed strands 6, bottom, center, and top fillers 4, groundwall insulation 7, and center separator 8, among other parts.

The components or materials described above may be produced by a variety of means, including laminating, extrusion, molding, and other processes with which one experienced in the art will be familiar. The construction materials used in a stator coil are copper and insulation. The copper is in the form of strands which are generally insulated, assembled, and converted into a bakelized coil or stack. The bakelized coil is insulated with groundwall insulation, but there are electrical stress control layers associated with it. A component affecting the thermal conductivity of the stator coil is the groundwall insulation, but other components benefit from being similarly improved. For example the stress control and other systems employed in the construction of stator coils can typically be of from 10 to 20% of the insulation thickness from copper to stator core. In some instances it is proposed to introduce structural changes to the materials in order to tune the thermal and electrical conductivities to the desired values.

By way of further example, an internal stress control layer may consist of a low conductivity layer, which may be connected to the copper directly or through resistance, or insulated from it. In such instances an insulating layer may be applied to the bakelized coil surface before the low conductivity layer is applied. An insulating tape or sheet may be applied onto the bakelized coil for the purpose of bonding or for smoothing of the surface to fill in void areas. Then an additional layer or layers of material having the required properties may be applied after the low conductivity layer. This may be for electrical purposes such as stress control or insulation.

After the groundwall is applied a low conductivity layer(s) is applied to the surface of the coil to ensure a good connection to the core, to obviate partial discharge and bar bounce effects while avoiding shorting core laminations. An application in which this low conductivity layer has an insulating layer applied over it has also been described in patent literature. The outer corona protection system may therefore include low conductivity, insulating, and part insulating layers.

To control the electrical stress in the stator end region a stress control layer is applied at the ends of the coil straight portion and into the endwindings or involute region. This normally consists of a silicon carbide loaded tape or paint, applied in one or several layers, sometimes stepped layers. It may also be combined with an insulating layer or a relatively high resistivity layer(s). In this application the high thermal conductivity materials will significantly enhance the thermal conductivity of the system. The choice of when to use a high thermal conductivity material will depend on the machine design and the thermal conductivity properties of the normal insulating material and of the groundwall.

In the end region glass tapes and shrink materials are used in certain types of design, for various functions such as consolidation and to enhance mechanical bracing. In addition the mechanical bracing of the endwinding region involves the use of resins, diamond spacers, conformable impregnateable materials such as felts or cloths, and materials into which resin can be loaded such as bags, bladders or hoses. In these components and materials the use of high thermal conductivity materials will significantly enhance the thermal conductivity of the system. The choice of where and when to use a high thermal conductivity material will depend on the machine design and the thermal conductivity properties of the normal insulating material.

In direct cooled rotors the cooling gas or medium is in direct contact with the copper. There are two main designs for direct cooling—radial cooling and axial cooling. The end-winding region may have a different method of cooling. In the radial cooled design the gas passes along a sub-slot or hollow turn at the bottom of each slot. It then passes radially through cooling slots in the solid copper turns and exhausts at the top of the slot. In the axial cooled design the turns are hollow and usually square or rectangular in cross section. Gas enters at each end through holes in the side walls of the hollow conductors and passes along the inside of the copper tubes, exhausting radially through holes in the copper at the rotor center.

In both these designs of rotor the effects of using high thermal conductivity materials on the design is significant. Indeed it may be more significant in indirectly cooled machines. The rotor coils are insulated from ground typically by molded epoxy glass laminates in the form of either slot cells or angles. Interturn insulation may be laminate or a glass. It can be appreciated that such components can be made highly thermally conducting by the use of the methods described herein.

One embodiment of the present invention adds high thermal conductivity (HTC) materials to resins to improve the thermal conductivity of the resins. In some embodiments the other physical properties of the resins are reduced in a trade-off with higher thermal conductivity, but in other embodiments, some of the other physical properties will not be significantly affected, and in some particular embodiments these other properties will be improved. In particular embodiments, the HTC materials are added to resins, such as LCT epoxy, that have ordered sub-structures. When added to these types of resins, the amount of HTC material used can be reduced versus use in resins without ordered sub-structures.

The HTC materials loaded into the resins are of a variety of substances that can be added so that they may physically and/or chemically interact with or react with the resins to improve thermal conductivity. In one embodiment, the HTC materials are dendrimers, and in another embodiment they are nano or micro inorganic fillers having a defined size or shape including high aspect ratio particles with aspect ratios (ratio mean lateral dimension to mean longitudinal dimension) of 3 to 100 or more, with a more particular range of 10-50.

As discussed, the nanofillers can themselves be surface functionalized. Surface treatments on, nano, meso and micro inorganic fillers, introduce a variety of surface functional groups which are capable of compatibilizing the inorganic surface with respect to the organic matrix or to allow chemical reactions to occur with the host organic matrix. These surface functional groups may include hydroxyl, carboxylic, amine, epoxide, silane or vinyl groups which will be available for chemical reaction with the host organic matrix. These functional groups may be applied using wet chemical methods, non-equilibrium plasma methods, chemical vapour and physical vapour deposition, laser beams, sputter ion plating and electron and ion beam evaporation methods.

Examples of exemplary types of resins for impregnation into mica paper can be found in U.S. patent application Ser. No. 11/152,984, "Structured Resin Systems with High Thermal Conductivity Fillers" by Smith et al, which is incorporated herein by reference.

Improvements in epoxy resins have recently been made by using liquid crystal polymers. By mixing an epoxy resin with a liquid crystal monomer or by incorporating a liquid crystalline mesogen into an epoxy resin molecule such as DGEBA, a liquid crystal thermoset (LCT) epoxy resin is produced that contains polymers or monomers that can be cross-linked to form ordered networks having significantly improved mechanical properties. See U.S. Pat. No. 5,904,984, which is incorporated herein by reference. A further benefit of LCTs is that they also have improved thermal conductivity over standard epoxy resins, and lower coefficient of thermal expansion (CTE) values as well.

What makes LCT epoxy resins even more appealing is that they are also better able to conduct heat than a standard epoxy resin. U.S. Pat. No. 6,261,481, which is incorporated herein by reference, teaches that LCT epoxy resins can be produced with a thermal conductivity greater than that of conventional epoxy resins. For example, a standard Bisphenol A epoxy is shown to have thermal conductivity values of 0.18 to 0.24 watts per meter degree Kelvin (W/mK) in both the transverse (plane) and thickness direction. By contrast, an LCT epoxy resin is shown to have a thermal conductivity value, when used in practical applications, of no more than 0.4 W/mK in the transverse direction and up to 0.9 W/mK in the thickness direction.

In addition to the standard mica (Muscovite,Phlogopite) that is typically used for electrical insulation there is also Biotite mica as well as several other Mica-like Alumino-Silicate materials such as Kaolinite, Halloysite, Montmorillonite and Chlorite. Montmorillonite has lattices in its structure which can be readily intercalated with HTC materials such as metal cations, organic compounds and monomers and polymers to give high dielectric strength composites.

Insulating papers are just one type of media that may use the treated mica of the present invention. Many other materials and components made therefrom, in many industries, can use different types of mica. While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A method for the treatment of micro pores within a mica paper comprising:
adding silane compounds to the mica paper such that the silane compounds travel within the micro pores of the mica paper, wherein the silane compounds have a molecular weight between approximately 15 and 300;
compressing the mica paper to contact mica flakelet surfaces of the mica paper with one another;
reacting the silane compounds with inner surfaces of the micro pores within the mica paper;
after said reacting, impregnating the mica paper with a resin;
wherein during said compressing, the mica paper is compressed by an amount between 5% and 30% of the original thickness of the mica paper prior to said compressing thereby yielding a desired degree of exposure of the contacted mica flakelet surfaces to the silane compounds with respect to a time necessary for the silane compounds to reach the micro pores of the mica paper for said reacting; and
wherein during said impregnating, the resin binds to the inner surfaces of the micro pores with the mica paper through the silane compounds to increase adhesion of the impregnating resin to the mica paper and to reduce micro void formation in the impregnated mica paper.

2. The method of claim 1, wherein the silane compounds are added to the mica paper by contacting the mica paper with a solution comprising the silane compounds and a solvent for the silane compounds.

3. The method of claim 2, wherein the solvent is substantially removed prior to said impregnating.

4. The method of claim 1, wherein the silane compounds comprise at least one of silane ($SiH_4$), silanol ($SiH_3OH$), methylsilane ($SiH_3CH_3$), vinylsilane ($SiH_3CHCH_2$), aminosilane ($SiH_3NH_2$), alkoxysilane ($SiH_3OR$) or epoxysilane.

5. The method of claim 1, wherein the silane compounds comprise at least one of amino methyl trimethyl silane, 3-glycidyl oxy propyl trimethoxy silane, vinyl dimethyl silane, or allyl trimethyl silane.

6. The method of claim 1, wherein the silane compounds comprise compounds having a molecular weight of between 32-90, and wherein the compounds having a molecular weight of between 32-90 have an increased tendency to travel into the micro pores of the mica paper relative to larger molecular weight silane compounds.

7. The method of claim 1, wherein the silane compounds comprise compounds having a molecular weight of between 100-300, and wherein the silane compounds having a molecular weight of between 100-300 have a decreased tendency to be disposed between contacted mica surfaces in the mica paper relative to lower molecular weight silane compounds.

8. The method of claim 7, wherein during said adding, the silane compounds comprise a plurality of silane compounds of different molecular weights.

9. The method of claim 1, wherein the impregnating resin comprises nanofillers.

10. The method of claim 9, wherein the nanofillers comprise 1-60% of the resin by weight.

11. The method of claim 9, wherein at least some of the nanofillers comprise surface functional groups that react with the silane compounds in the mica paper.

12. The method of claim 1, wherein said compressing is done prior to said adding silane compounds.

13. The method of claim 12, further comprising additionally compressing the mica paper after said adding to remove excess silane compounds.

14. A method for the treatment of micro pores within a mica paper comprising:
adding silane compounds to the mica paper such that the silane compounds travel within the micro pores of the mica paper, wherein the silane compounds have a molecular weight between approximately 15 and 300;
compressing the mica paper to contact mica flakelet surfaces of the mica paper with one another and to reduce the likelihood of the silane compounds being disposed between the contacted mica flakelet surfaces of the mica paper during said adding;
reacting the silane compounds with inner surfaces of the micro pores within the mica paper;
after said reacting, impregnating the mica paper with a resin;
additionally compressing the mica paper during said impregnating of the resin, wherein an amount of compression for the additional compression is approximately the same as an amount of compression to contact mica flakelet surfaces of the mica paper with one another;
wherein during said impregnating, the resin binds to the inner surfaces of the micro pores with the mica paper through the silane compounds to increase adhesion of the resin to the mica paper and to reduce microvoid formation in the impregnated mica paper.

15. The method of claim 14, wherein during said compressing the mica paper to contact mica flakelet surfaces of the mica paper with one another, an amount of compression of the mica paper is between 5-30% of a thickness of the mica paper prior to said compressing.

16. The method of claim 14, wherein said compressing the mica paper to contact mica flakelet surfaces of the mica paper with one another is done prior to said adding silane compounds.

17. The method of claim 16, wherein the silane compounds are added to the mica paper by contacting the mica paper with a solution comprising the silane compounds and a solvent for the silane compounds, and wherein the mica paper is substantially dried of the solution prior to the resin impregnation.

18. The method of claim 14, wherein the silane compounds comprise compounds having a molecular weight of between 32-90, and wherein the compounds having a molecular weight of between 32-90 have an increased tendency to travel into the micro pores of the mica paper relative to larger molecular weight silane compounds.

19. The method of claim 14, wherein said resin is an epoxy resin.

* * * * *